United States Patent
Shen et al.

(10) Patent No.: US 9,748,397 B2
(45) Date of Patent: Aug. 29, 2017

(54) THIN FILM TRANSISTOR SUBSTRATE AND DISPLAY DEVICE COMPRISING THE SAME

(71) Applicant: InnoLux Corporation, Miao-Li County (TW)

(72) Inventors: I-Ho Shen, Miao-Li County (TW); Jung-Fang Chang, Miao-Li County (TW)

(73) Assignee: INNOLUX CORPORATION (TW)

( * ) Notice: Subject to any disclaimer, the term of this patent is extended or adjusted under 35 U.S.C. 154(b) by 0 days.

(21) Appl. No.: 14/873,236

(22) Filed: Oct. 2, 2015

(65) Prior Publication Data
US 2016/0111450 A1    Apr. 21, 2016

(30) Foreign Application Priority Data
Oct. 20, 2014 (TW) .............................. 103136119 A

(51) Int. Cl.
| | |
|---|---|
| H01L 29/786 | (2006.01) |
| H01L 51/05 | (2006.01) |
| H01L 27/28 | (2006.01) |
| H01L 51/00 | (2006.01) |

(52) U.S. Cl.
CPC ...... *H01L 29/78618* (2013.01); *H01L 27/288* (2013.01); *H01L 29/78621* (2013.01); *H01L 29/78696* (2013.01); *H01L 51/0558* (2013.01); *H01L 51/0053* (2013.01); *H01L 51/0068* (2013.01)

(58) Field of Classification Search
CPC ............. H01L 27/1222; H01L 27/1225; H01L 29/78666; H01L 29/78675; H01L 29/7869; H01L 51/0067; H01L 51/0068; H01L 51/0541
See application file for complete search history.

(56) References Cited

U.S. PATENT DOCUMENTS

| | | | |
|---|---|---|---|
| 5,917,199 A | 6/1999 | Byun et al. | |
| 2006/0102894 A1* | 5/2006 | Masuda | H01L 51/0021 257/40 |
| 2006/0262066 A1* | 11/2006 | Yamazaki | G09G 3/20 345/98 |

(Continued)

FOREIGN PATENT DOCUMENTS

| | | |
|---|---|---|
| CN | 103472640 A | 12/2013 |
| TW | 201338230 A | 9/2013 |

(Continued)

*Primary Examiner* — Karen Kusumakar
(74) *Attorney, Agent, or Firm* — Bacon & Thomas, PLLC

(57) ABSTRACT

A thin-film transistor substrate is disclosed, which comprises a base layer; a semiconductor layer disposed on the base layer; a source electrode and a drain electrode disposed on the semiconductor layer; and a gate electrode disposed on the base layer and corresponding to the semiconductor layer; wherein the semiconductor layer includes a first region, a second region, and a third region, in which the first region corresponds to the gate electrode layer, the second region corresponds to the source electrode, and the third region corresponds to the drain electrode; and wherein the first region has a first thickness, the second region has a second thickness, and the third region has a third thickness, and the first thickness is greater than the second thickness or the third thickness.

14 Claims, 3 Drawing Sheets

(56) References Cited

U.S. PATENT DOCUMENTS

| | | | |
|---|---|---|---|
| 2008/0217609 A1* | 9/2008 | Aoki | H01L 51/0541 |
| | | | 257/40 |
| 2009/0021661 A1* | 1/2009 | Tsuboi | H01L 29/78621 |
| | | | 349/43 |
| 2009/0294808 A1* | 12/2009 | Ito | H01L 21/67132 |
| | | | 257/288 |

FOREIGN PATENT DOCUMENTS

| | | |
|---|---|---|
| TW | 201432915 A | 8/2014 |
| TW | 201435433 A | 9/2014 |
| TW | 201436242 A | 9/2014 |

\* cited by examiner

THIN FILM TRANSISTOR SUBSTRATE AND DISPLAY DEVICE COMPRISING THE SAME

CROSS REFERENCE TO RELATED APPLICATION

This application claims the benefits of the Taiwan Patent Application Serial Number 103136119, filed on Oct. 20, 2014, the subject matter of which is incorporated herein by reference.

BACKGROUND OF THE INVENTION

1. Field of the Invention

The present disclosure relates to a thin-film transistor substrate and a display device comprising the same, and especially to a thin-film transistor substrate capable of reducing the series impedance between source/drain electrodes and the semiconductor layer and a display device comprising the same.

2. Description of Related Art

With the progressive development of display technology, all the devices are developed following the trend of minimization, thinness, light weight and so on, and the mainstream display devices have evolved from cathode ray tubes to the display devices (LCDs) or organic light emitting diode devices (OLEDs).

Typical thin film transistors (TFTs) are classified into the top gate structure and the bottom gate structure. Comparing the top gate oxide semiconductor TFT with the bottom gate oxide semiconductor TFT, the top gate structure has the advantages of: reducing the size of TFT for higher resolution; and reducing the parasitic capacitance between gate and source/drain electrodes to reduce signal distortion upon a display operation.

However, in the top gate structure, the series impedance between source/drain electrodes and the semiconductor layer is overly high, thus decreasing the on current of the thin film transistor, which in turn, results in problems such as insufficient charging of the storage capacitor and overly high power consumption.

In view of above, what is needed in the art is to develop a thin-film transistor substrate to solve the above problems to provide a display device with more stable quality and longer service lifetime.

SUMMARY OF THE INVENTION

An object of the present disclosure is to provide a thin-film transistor substrate capable of reducing the series impedance between source/drain electrodes and the semiconductor layer.

Another object of the present disclosure is to provide a display device capable of solving the problems such as insufficient charging of a storage capacitor, overly high power consumption and so on.

In order to achieve the above object, the present disclosure provides a thin-film transistor substrate and a display device including the same. The thin-film transistor substrate comprises a base layer; a semiconductor layer disposed on the base layer; a source electrode and a drain electrode disposed on the semiconductor layer; and a gate electrode disposed on the base layer and corresponding to the semiconductor layer; wherein the semiconductor layer includes a first region, a second region, and a third region, in which the first region corresponds to the gate electrode layer, the second region corresponds to the source electrode, and the third region corresponds to the drain electrode; and wherein the first region has a first thickness, the second region has a second thickness, and the third region has a third thickness, and the first thickness is greater than the second thickness or the third thickness.

In the thin-film transistor substrate of the present disclosure, the second thickness or the third thickness may be 1-50% of the first thickness.

In the thin-film transistor substrate of the present disclosure, the semiconductor layer may further include a fourth region located between the first region and the second region, and the fourth region has a fourth thickness between the first thickness and the second thickness. The second thickness may be 1-50% of the fourth thickness.

In the thin-film transistor substrate of the present disclosure, the semiconductor layer may further include a fifth region located between the first region and the third region, and the fifth region has a fifth thickness between the first thickness and the third thickness. The third thickness may be 1-50% of the fifth thickness.

In the thin-film transistor substrate of the present disclosure, the second region has a first side adjacent to the first region and a second side opposite to the first side; and the semiconductor layer may further comprise a sixth region which is adjacent to the second side of the second region, and the sixth region has a sixth thickness between the first thickness and the second thickness.

In the thin-film transistor substrate of the present disclosure, the third region has a first side adjacent to the first region and a second side opposite to the first side; and the semiconductor layer may further comprise a seventh region which is adjacent to the second side of the third region, and the seventh region has a seventh thickness between the first thickness and the third thickness.

In the present disclosure, the thin-film transistor substrate may be a top gate thin-film transistor substrate.

In addition, the present disclosure further provides a display device, comprising: the above-described thin-film transistor substrate; a counter substrate disposed over the thin-film transistor substrate; and a display unit disposed between the thin-film transistor substrate and the counter substrate. The display device may be an organic light emitting diode device (OLED) or a liquid crystal display device (LCD).

Accordingly, the specific structure of the semiconductor layer in the present disclosure allows each region of the semiconductor layer to have different impedance distribution, and thus reduce the series impedance between source/drain electrodes and the semiconductor layer, and prevent the decrease of on current of the thin-film transistor substrate, thereby solving the problems such as insufficient charging of a storage capacitor, overly high power consumption and so on.

DETAILED DESCRIPTION OF THE PREFERRED EMBODIMENT

Hereafter, examples will be provided to illustrate the examples of the present disclosure. Other advantages and effects of the disclosure will become more apparent from the disclosure of the present disclosure. Other various aspects also may be practiced or applied in the disclosure, and various modifications and variations can be made without departing from the spirit of the disclosure based on various concepts and applications.

Embodiment 1

Figure 1:
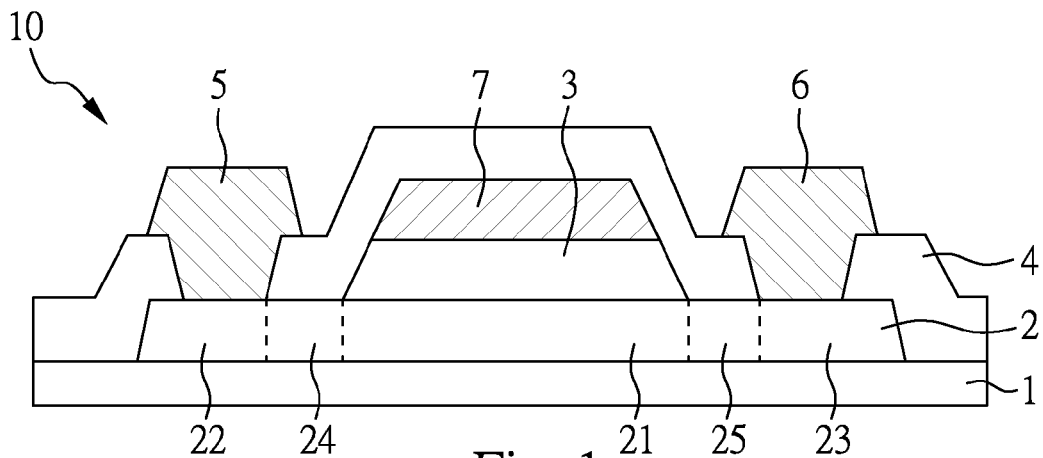
FIG. 1 shows a schematic diagram of the thin-film transistor substrate according to a preferred embodiment of the present disclosure.
Figure 2:
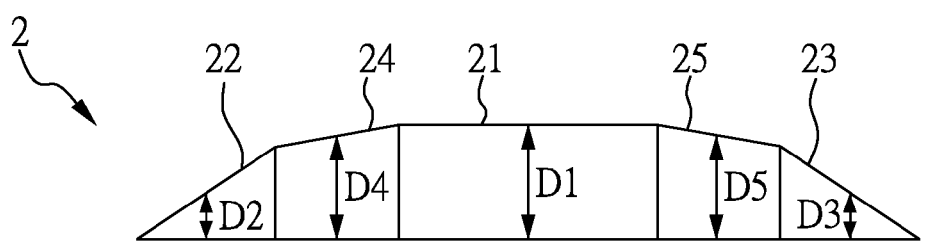
FIG. 2 is an enlarged view of the semiconductor layer in the thin-film transistor substrate of FIG. 1.

Referring to FIG. 1, the present disclosure provides a thin-film transistor substrate 10, comprising a base layer 1; a semiconductor layer 2 disposed on the base layer 1; a first insulating layer 3, a second insulating layer 4, a source electrode 5 and a drain electrode 6, which are all disposed on semiconductor layer 2; and a gate electrode 7 disposed on the base layer 1 and corresponding to the semiconductor layer 2; wherein the semiconductor layer 2 includes a first region 21, a second region 22, and a third region 23, in which the first region 21 corresponds to the gate electrode layer 7, the second region 22 corresponds to the source electrode 5, and the third region 23 corresponds to the drain electrode 6. FIG. 2 is an enlarged view of the semiconductor layer. The first region 21 has a first thickness D1, the second region 22 has a second thickness D2, and the third region 23 has a third thickness D3, and the first thickness D1 is greater than the second thickness D2 or the third thickness D3. In the present disclosure, the first thickness D1, the second thickness D2 and the third thickness D3 are not particularly limited. For example, one of the second thickness D2 and the third thickness D3 may be 1-90% of the first thickness D1, preferably 1-70%, and more preferably 1-50%. In this embodiment, the average first thickness D1 is 0.056 μm, the average second thickness D2 and the average third thickness D3 are 0.023 μm. However, the second thickness D2 and the third thickness D3 may be the same or different, and may be adjusted depending on the practical requirements.

In this embodiment, referring to FIG. 2, the semiconductor layer 2 further includes a fourth region 24 and a fifth region 25, wherein the fourth region 24 is located between the first region 21 and second region 22, and the fifth region 25 is located between the first region 21 and the third region 23. The fourth region 24 has a fourth thickness D4, and the fifth region 25 has a fifth thickness D5. The fourth thickness D4 is between the first thickness D1 and the second thickness D2, and the fifth the thickness D5 is between the first thickness D1 and the third thickness D3. In the present disclosure, the fourth thickness D4 and the fifth thickness D5 are not particularly limited. For example: the second thickness D2 may be 1 to 50% of the fourth thickness, while the third thickness D3 may be 1-50% of the fifth thickness D5. In this embodiment, the fourth thickness D4 and the fifth thickness D5 are 0.046 μm. However, the fourth thickness D4 and the fifth thickness D5 may be the same or different, and may be adjusted depending on the practical requirements.

Accordingly, in this embodiment, since the second thickness D2 and the third thickness D3 are substantially the same, and the fourth thickness D4 and the fifth thickness D5 are substantially the same, the cross-sectional view of the semiconductor layer 2 is substantially symmetrical with respect to the thickness direction of the first region 21. However, the semiconductor layer of the present disclosure is not limited thereto.

Figure 3:
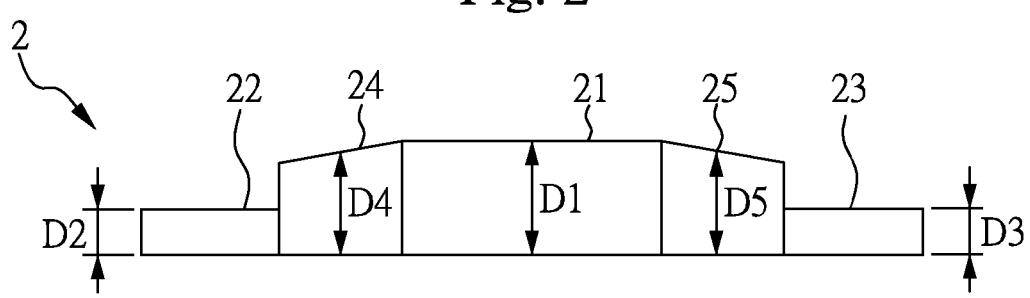
FIG. 3 is an enlarged view of the semiconductor layer according to another preferred embodiment of the present disclosure.

As shown in FIG. 2, the top surface of the first region 21 is a horizontal plane, and the top surfaces of the second region 22 and the third region 23 are inclined planes. Alternatively, the structure of the semiconductor layer 2 may be as shown in FIG. 3, wherein the top surfaces of the first region 21, the second region 22 and the third region 23 are all horizontal planes. Here, referring to FIG. 1, the term "horizontal plane" is defined as a surface parallel to the base layer under the semiconductor layer 2, while the term "inclined plane" is defined as a surface having an acute angle θ(0°<θ<90°) with respect to the base layer under the semiconductor layer 2. A person skilled in the art may simply adjust the pattern of the semiconductor layer 2 according to the needs of the subsequent processes, as long as it satisfies the condition that the first thickness D1 is greater than the second thickness D2 or the third thickness D3.

Figure 4:
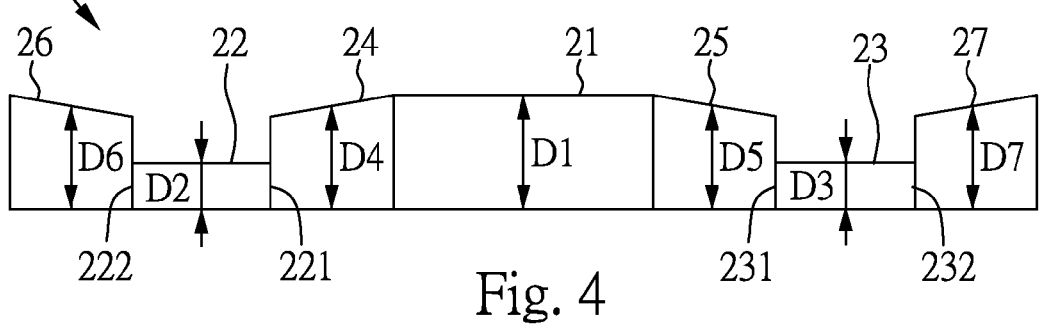
FIG. 4 is an enlarged view of the semiconductor layer according to further preferred embodiment of the present disclosure.

Alternatively, as shown in FIG. 4, the semiconductor layer 2 may further comprise a sixth region 26 and a seventh region 27, wherein the second region 22 has a first side 221 and a second side 222 opposite to the first side 221, and the first side 221 is adjacent to the first region 21 and the fourth region 24, while the second side 222 is adjacent to the sixth region 26. The third region 23 has a first side 231 and a second side 232 opposite to the first side 231, and the first side 231 is adjacent to the first region 21 and the fifth region 25, while the second side 232 is adjacent to the seventh region 27. The sixth region 26 has a sixth thickness D6, and the seventh region 27 has a seventh thickness D7, wherein the sixth thickness D6 is between the first thickness D1 and the second thickness D2, while the seventh thickness D7 is between the first thickness D1 and the third thickness D3. In this embodiment, the sixth thickness D6 is similar to the fourth thickness D4, and the seventh thickness D7 is similar to the fifth thickness D5; but the present disclosure is not limited thereto.

In the present disclosure, the term "thickness" refers to an average thickness of a region. Specifically, the thickness values of at least three random positions are measured, and averaged to obtain an average thickness of a region. Preferably at least five positions, and more preferably ten positions are selected for measurement, so as to obtain a more accurate average thickness value. The method for measuring the "thickness" is not particularly limited, and may be a common measuring method in the art, such as the scanning electron microscope (SEM).

In the present disclosure, the thin-film transistor substrate may be produced by a conventional process for manufacturing a thin-film transistor substrate. Referring to FIG. 1, in short, in the production of the thin-film transistor substrate, the above-described patterned semiconductor layer 2 having the first region 21, the second region 22 and the third region 23 is first provided, wherein the average thicknesses of the first region 21, the region 22 and the third region 23 may be adjusted according to the materials used. Then, the patterned semiconductor layer 2 is deposited on the base layer 1, and an insulating layer material is deposited on the semiconductor layer 2. After that, the gate electrode material and the insulating layer material are etched by plasma treatments to form the gate electrode 7 and the first insulating layer 3, followed by the deposition of an insulating layer material thereon, and the insulating layer material is then etched by a plasma treatment to form the second insulating layer 4 having openings for accommodating the source electrode 5 and the drain electrode 6. Finally, an electrode material is deposited at the openings of the second insulating layer 4 to form the source electrode 5 and the drain electrode 6 in direct contact with the semiconductor layer 2, completing the fabrication of the top gate thin-film transistor substrate.

Figure 5:
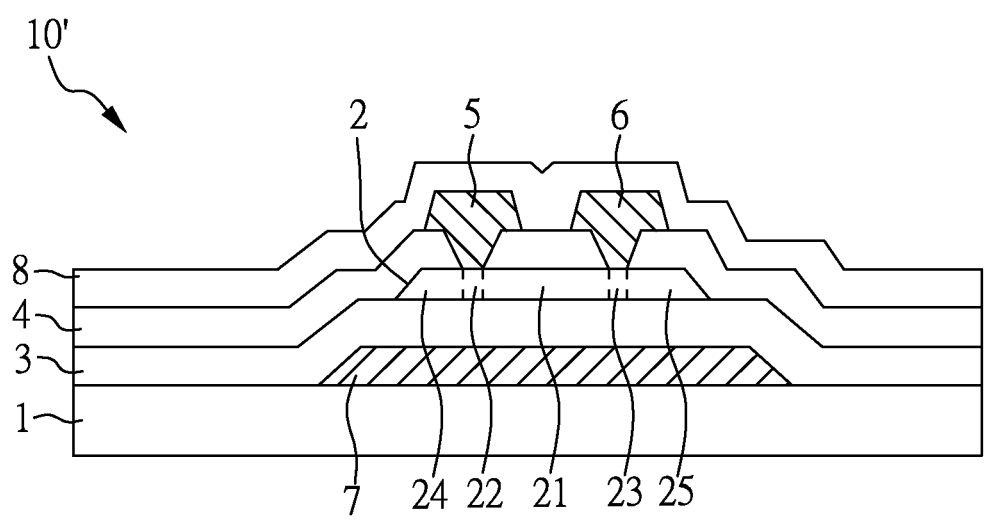
FIG. 5 shows a schematic diagram of the thin-film transistor substrate according to another preferred embodiment of the present disclosure.

However, a bottom gate thin-film transistor substrate may also be used in the present disclosure, and may be simply adjusted by a person skilled in the art depending on the actual requirements to include structures known in the art, such as the etching stop layer structure (ESL), the back channel etching structure (BCE) and the like. For example, in the bottom gate thin-film transistor substrate, the etching barrier layer as illustrated in FIG. 5 may be formed by sequentially depositing a gate electrode 7, a first insulating layer 3, a semiconductor layer 2, a second insulating layer 4, a source electrode 5 and a drain electrode 6 on a base layer 1, and a protective layer 8 may be further optionally disposed on the source electrode 5 and the drain electrode 6 to obtain the bottom gate thin-film transistor substrate 10'. Similarly, in the production of the thin-film transistor substrate 10', the patterned semiconductor layer 2 having the first region 21, the second region 22, the third region 23, the forth region 24 and the fifth region 25 is provided before proceeding to the next process, wherein the first region 21 corresponds to the gate electrode 7 and is located between the second region 22 and the third region 23, and the second region 22 corresponds to the source electrode 5, while the third region 23 corresponds to the drain electrode 6. The fourth region 24 is disposed at the side opposite to a side of the second region 22 adjacent to the first region 21, and the fifth region 25 is disposed at the side opposite to a side of the third region 23 adjacent to the first region 21. In this embodiment, the thicknesses of the first region 21, the fourth region 24 and the fifth region 25 are substantially the same and greater than the thicknesses of the second region 22 and the third region 23 (the thicknesses of the second region 22 and third region 23 are substantially the same).

In addition, a common substrate in the art, such as a glass substrate, a plastic substrate, a silicon substrate, a ceramic substrate and the like, may be used as the base layer 1. Furthermore, each of the source electrode 5, the drain electrode 6 and the gate electrode 7 may be made of a common conductive material in the art, such as a metal, an alloy, a metal oxide, a metal oxynitride, or other electrode materials commonly used in the art, and preferably a metal, but the present disclosure is not limited thereto. If desired, a composite electrode of a transparent electrode and a semi-transparent electrode, such as a composite electrode of a TCO electrode and a platinum electrode, may be used. As for the semiconductor layer 2, a common semiconductor material in the art, e.g., indium gallium zinc oxide (IGZO), indium tin zinc oxide (ITZO), other metal oxide semiconductors, amorphous silicon, polysilicon, crystalline silicon, and organic semiconductors such as P13, DH4T, pentanene and so on, may be used. In addition, the material of the first insulating layer 3 and second insulating layer 4 may be a common passivation material in the art, such as silicon nitride (SiNx), silicon oxide (SiOx) or a combination thereof. However, the present disclosure is not limited thereto.

Therefore, in order to make the impedance of the regions of the semiconductor layer comply with the condition: the first region≥ the fourth region (similar to the fifth region) >the second region (similar to the third region), the semiconductor layer is subjected to a plasma treatment for patterning such that the thickness of regions of the semiconductor layer comply with the condition: the first region-≥the fourth region (similar to the fifth region)>the second region (similar to the third region). Accordingly, since the regions of the semiconductor layer have different thicknesses, they have different impedance after the plasma treatment. The thinner the region, the lower the impedance, and thus the series impedance between the source/drain electrodes and the semiconductor layer is reduced, and the decrease of on current of the thin-film transistor substrate form is prevented, thereby solving the problems such as insufficient charging of a storage capacitor, overly high power consumption and so on.

Example 2

Figure 6:
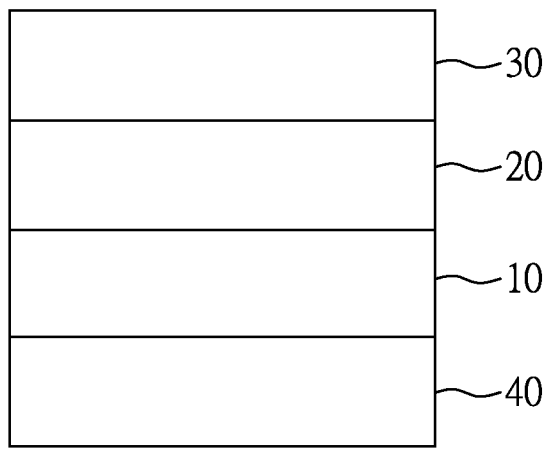
FIG. 6 shows a schematic diagram of the display device according to a preferred embodiment of the present disclosure.
Figure 7:
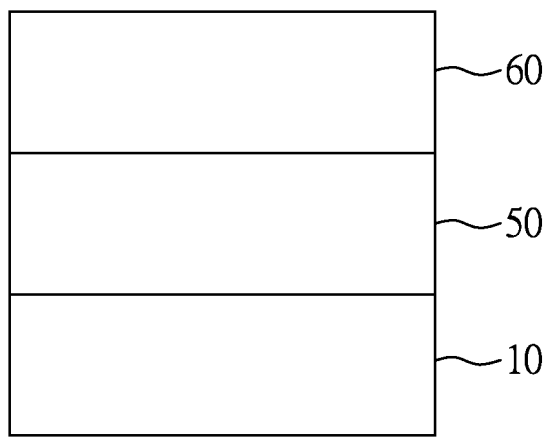
FIG. 7 shows a schematic diagram of the display device according to another preferred embodiment of the present disclosure.

The present disclosure further provides a display device, comprising: the above-described thin-film transistor substrate; a counter substrate disposed over the thin-film transistor substrate; and a display unit disposed between the thin-film transistor substrate and counter substrate. As shown in FIG. 6, when the display device of the present disclosure is a liquid crystal display device (LCD), a liquid crystal unit 20 and a color filter 30 disposed on the thin-film transistor substrate 10 and a backlight module 40 disposed under the thin-film transistor substrate 10 are further included. Alternatively, as shown in FIG. 7, when the display device of the present disclosure is an organic light-emitting diode device (OLED), an organic light-emitting diode 50 and a package substrate (or a thin-film package module) 60 disposed on the thin-film transistor substrate 10 are further included. In addition, as will be appreciated by a person skilled in the art, the present disclosure may include any conventional elements which are omitted from the drawings clarity. For example, the organic light emitting diode 50 may include a first electrode, an organic light-emitting layer and a second electrode, and other organic light emitting diode elements which may facilitate the combination or transportation of electrons and holes, such as an electron transporting layer, an electron injection layer, a hole transporting layer, a hole injection layer and the like. Furthermore, the display device of the present disclosure may be applied to any electronic device known in the art, such as a monitor, mobile a phone, a notebook computer, a video camera, a camera, a music player, a mobile navigation device, a television and the like.

Although the present disclosure has been explained in relation to its preferred embodiment, it is to be understood that many other possible modifications and variations can be made without departing from the spirit and scope of the disclosure as hereinafter claimed.

What is claimed is:
1. A thin-film transistor substrate, comprising:
a base layer;
a semiconductor layer disposed on the base layer;
a source electrode and a drain electrode disposed on the semiconductor layer; and
a gate electrode disposed on the semiconductor layer;
wherein the semiconductor layer includes a first region, a second region, and a third region, in which the first region corresponds to the gate electrode layer, the second region corresponds to the source electrode, and the third region corresponds to the drain electrode; and wherein the first region has a first thickness, the second region has a second thickness, and the third region has a third thickness, and the first thickness is greater than the second thickness or the third thickness.

2. The thin-film transistor substrate of claim 1, wherein the second thickness or the third thickness is 1-50% of the first thickness.

3. The thin-film transistor substrate of claim 1, wherein the semiconductor layer further comprises a fourth region located between the first region and the second region, and the fourth region has a fourth thickness between the first thickness and the second thickness.

4. The thin-film transistor substrate of claim 3, wherein the second thickness is 1-50% of the fourth thickness.

5. The thin-film transistor substrate of claim 1, wherein the semiconductor layer further comprises a fifth region located between the first region and the third region, and the fifth region has a fifth thickness between the first thickness and the third thickness.

6. The thin-film transistor substrate of claim 5, wherein the third thickness is 1-50% of the fifth thickness.

7. The thin-film transistor substrate of claim 1, wherein the second region has a first side adjacent to the first region and a second side opposite to the first side; and the semiconductor layer further comprises a sixth region which is adjacent to the second side of the second region, and the sixth region has a sixth thickness between the first thickness and the second thickness.

8. The thin-film transistor substrate of claim 1, wherein the third region has a first side adjacent to the first region and a second side opposite to the first side; and the semiconductor layer further comprises a seventh region which is adjacent to the second side of the third region, and the seventh region has a seventh thickness between the first thickness and the third thickness.

9. The thin-film transistor substrate of claim 1, which is a top gate thin-film transistor substrate.

10. The thin-film transistor substrate of claim 1, wherein the semiconductor layer is made of indium gallium zinc oxide (IGZO), indium tin zinc oxide (ITZO), or other metal oxide semiconductors.

11. The thin-film transistor substrate of claim 1, wherein the semiconductor layer is amorphous silicon, polycrystalline silicon, or crystalline silicon.

12. The thin-film transistor substrate of claim 1, wherein the semiconductor layer is an organic semiconductor of P13, DH4T, or pentanene.

13. A display device, comprising:
the thin-film transistor substrate of claim 1;
a counter substrate disposed over the thin-film transistor substrate; and
a display unit disposed between the thin-film transistor substrate and the counter substrates.

14. The display device of claim 13, which is an organic light-emitting diode device (OLED) or a liquid crystal display (LCD).

* * * * *